(12) United States Patent
Chiu et al.

(10) Patent No.: US 9,985,191 B2
(45) Date of Patent: May 29, 2018

(54) LED PACKAGE STRUCTURE

(71) Applicants: LITE-ON OPTO TECHNOLOGY (CHANGZHOU) CO., LTD., Changzhou, Jiangsu (CN); LITE-ON TECHNOLOGY CORPORATION, Taipei (TW)

(72) Inventors: Kuo-Ming Chiu, New Taipei (TW); Meng-Sung Chou, New Taipei (TW); Hung-Jui Chen, New Taipei (TW); Han-Hsing Peng, New Taipei (TW)

(73) Assignees: LITE-ON OPTO TECHNOLOGY (CHANGZHOU) CO., LTD., Changzhou, Jiangsu Province (CN); LITE-ON TECHNOLOGY CORPORATION, Taipei (TW)

( * ) Notice: Subject to any disclaimer, the term of this patent is extended or adjusted under 35 U.S.C. 154(b) by 1 day.

(21) Appl. No.: 15/231,214

(22) Filed: Aug. 8, 2016

(65) Prior Publication Data

US 2017/0263833 A1 Sep. 14, 2017

(30) Foreign Application Priority Data

Mar. 14, 2016 (CN) .......................... 2016 1 0143697

(51) Int. Cl.
*H01L 33/62* (2010.01)
*H01L 33/60* (2010.01)
*H01L 33/54* (2010.01)
*H01L 33/48* (2010.01)
*H01L 33/58* (2010.01)

(52) U.S. Cl.
CPC ............ *H01L 33/62* (2013.01); *H01L 33/486* (2013.01); *H01L 33/58* (2013.01); *H01L 33/60* (2013.01)

(58) Field of Classification Search
None
See application file for complete search history.

(56) References Cited

U.S. PATENT DOCUMENTS

| 2009/0050925 | A1* | 2/2009 | Kuramoto | H01L 33/486 257/100 |
| 2009/0294940 | A1* | 12/2009 | Sugimoto | H01L 33/641 257/680 |
| 2013/0294471 | A1* | 11/2013 | Palaniswamy | H01L 33/486 372/43.01 |
| 2014/0226308 | A1* | 8/2014 | Fukuda | F21V 31/005 362/84 |

(Continued)

*Primary Examiner* — Su C Kim
*Assistant Examiner* — David S Wilbert
(74) *Attorney, Agent, or Firm* — Li & Cai Intellectual Property (USA) Office

(57) ABSTRACT

An LED package structure includes a ceramic substrate, a ceramic board, a light-emitting unit, a first adhesive layer, a second adhesive layer, and a cover. The ceramic board having a thru-hole is disposed on the ceramic substrate. The light-emitting unit is disposed on the ceramic substrate and is arranged in the thru-hole of the ceramic board. The first and second adhesive layers are disposed on the ceramic board, and the second adhesive layer covers the first adhesive layer. The cover is fixed on the ceramic board by the first and second adhesive layers. Thus, the shearing force of the LED package structure of the instant disclosure is increased by having the first and second adhesive layers, which are connected to each other.

20 Claims, 19 Drawing Sheets

(56) References Cited

U.S. PATENT DOCUMENTS

2016/0181479 A1* 6/2016 Kim ................... H01L 33/486
                                                                257/98
2016/0306265 A1* 10/2016 Riel ..................... G02B 7/02

* cited by examiner

LED PACKAGE STRUCTURE

BACKGROUND OF THE INVENTION

1. Field of the Invention

The instant invention relates to an LED; in particular, to an LED package structure having a dual adhesive layer.

2. Description of Related Art

The conventional LED package structure includes a base, a cover, and a single adhesive layer bonding the cover to the base. The bonding force between the cover and the base is attributed to the single adhesive layer and can be improved. Specifically, when the cover is pressed on the single adhesive layer of the conventional non-sealed type LED package structure (i.e., an inner space of the conventional LED package structure is in air communication with an outer space), the single adhesive layer flows easily and locates at a non-predetermined position.

SUMMARY OF THE INVENTION

The instant disclosure provides an LED package structure for effectively solving the problems generated from the conventional LED package structure.

In summary, the second adhesive layer of the LED package structure of the instant disclosure is approximately formed at a predetermined position by the bonding force between the first adhesive layer and the second adhesive layer when the cover is disposed on the second adhesive layer. Compared to the conventional single adhesive layer, the shearing force of the LED package structure of the instant disclosure is effectively increased by the cooperation of the first adhesive layer and the second adhesive layer.

In order to further appreciate the characteristics and technical contents of the instant invention, references are hereunder made to the detailed descriptions and appended drawings in connection with the instant invention. However, the appended drawings are merely shown for exemplary purposes, rather than being used to restrict the scope of the instant invention.

DETAILED DESCRIPTION OF THE PREFERRED EMBODIMENTS

[First Embodiment]

Please refer to FIGS. 1 through 9, which show a first embodiment of the instant disclosure. References are hereunder made to the detailed descriptions and appended drawings in connection with the instant invention. However, the appended drawings are merely shown for exemplary purposes, rather than being used to restrict the scope of the instant invention.

Figure 1:
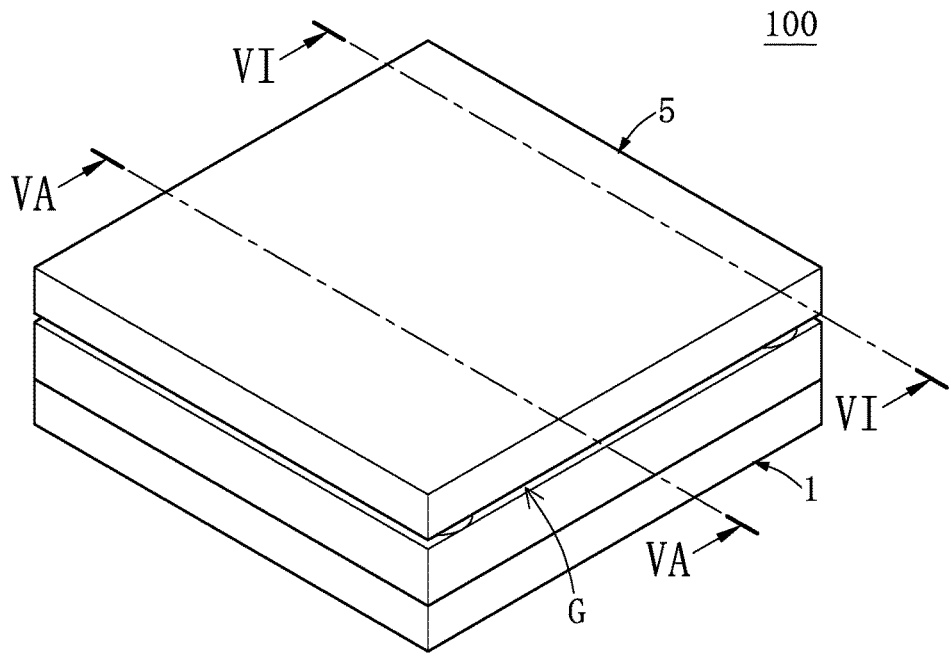
FIG. 1 is a perspective view showing an LED package structure according to a first embodiment of the instant disclosure.
Figure 2:
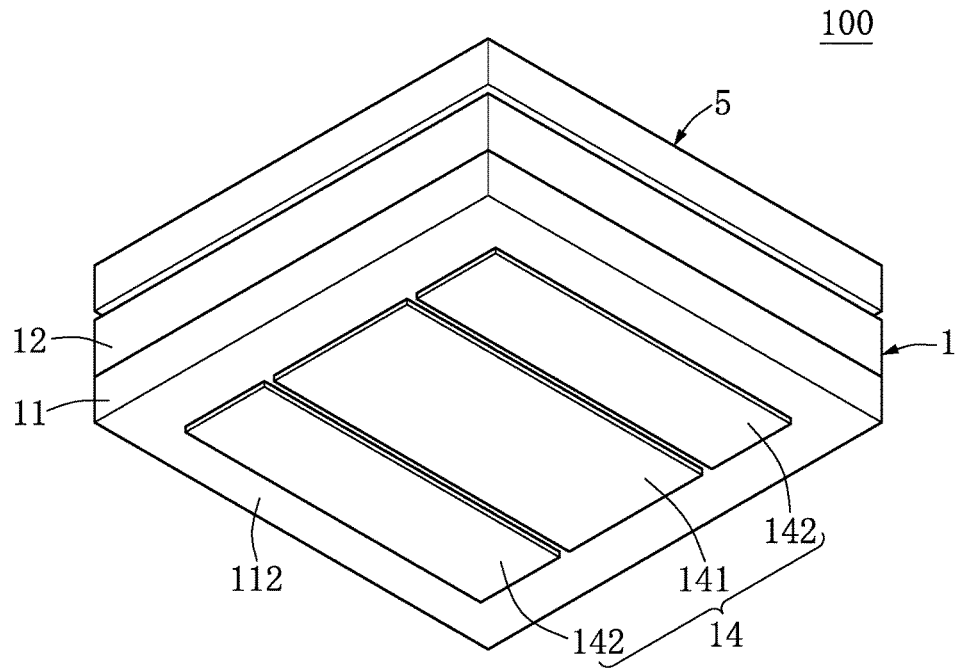
FIG. 2 is a perspective view of FIG. 1 from another perspective.
Figure 3:
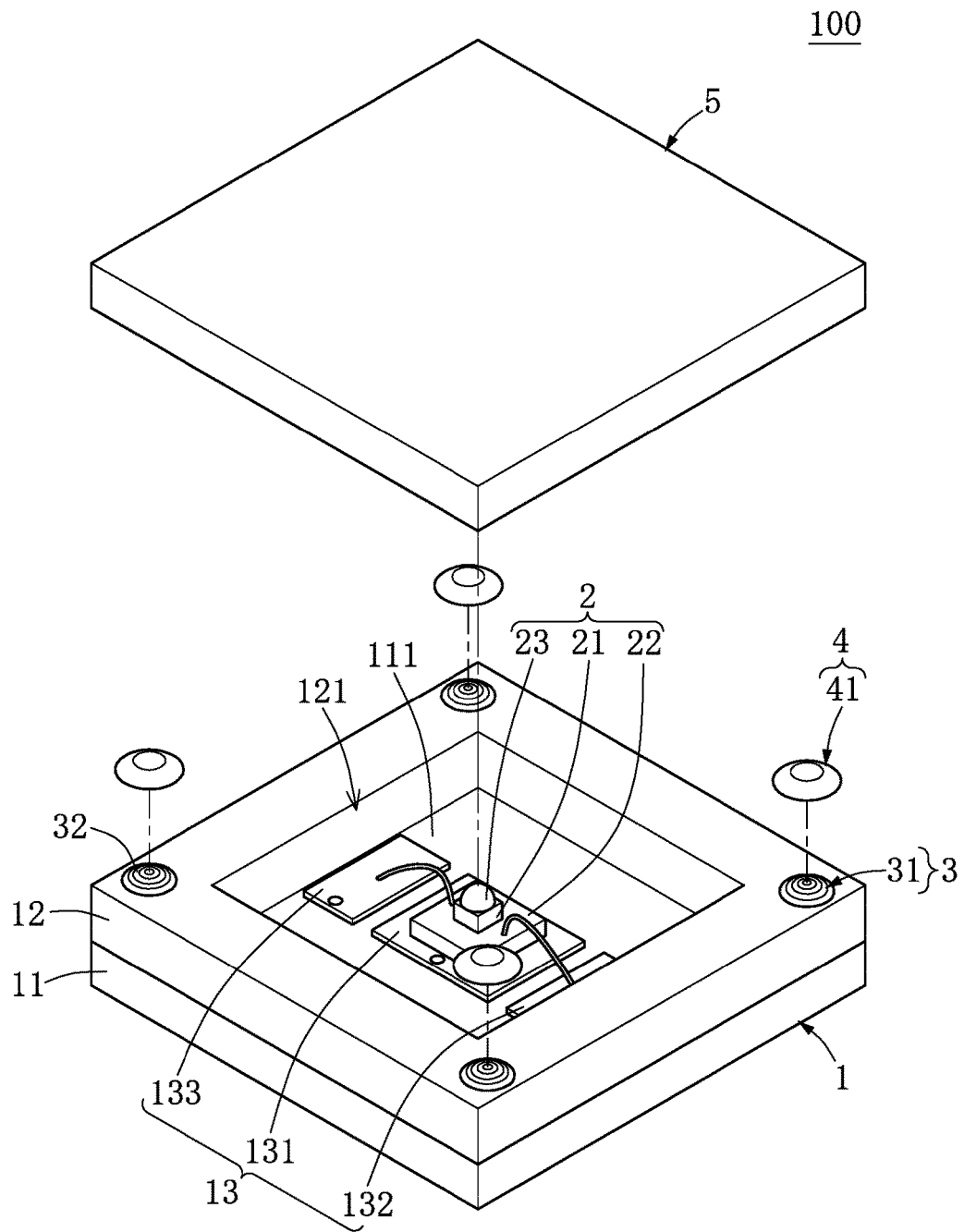
FIG. 3 is an exploded view of FIG. 1.

Please refer to FIGS. 1 through 3, which show an LED package structure 100 for emitting a deep UV light, but the instant disclosure is not limited thereto. The LED package structure 100 includes a base 1, a light-emitting unit 2, a first adhesive layer 3 and a second adhesive layer 4 both disposed on the base 1 and adhered to each other, and a cover 5 fixed on the second adhesive layer 4. The following description discloses the construction of each component of the LED package structure 100, and then discloses the relative features of the components of the LED package structure 100.

Figure 4:
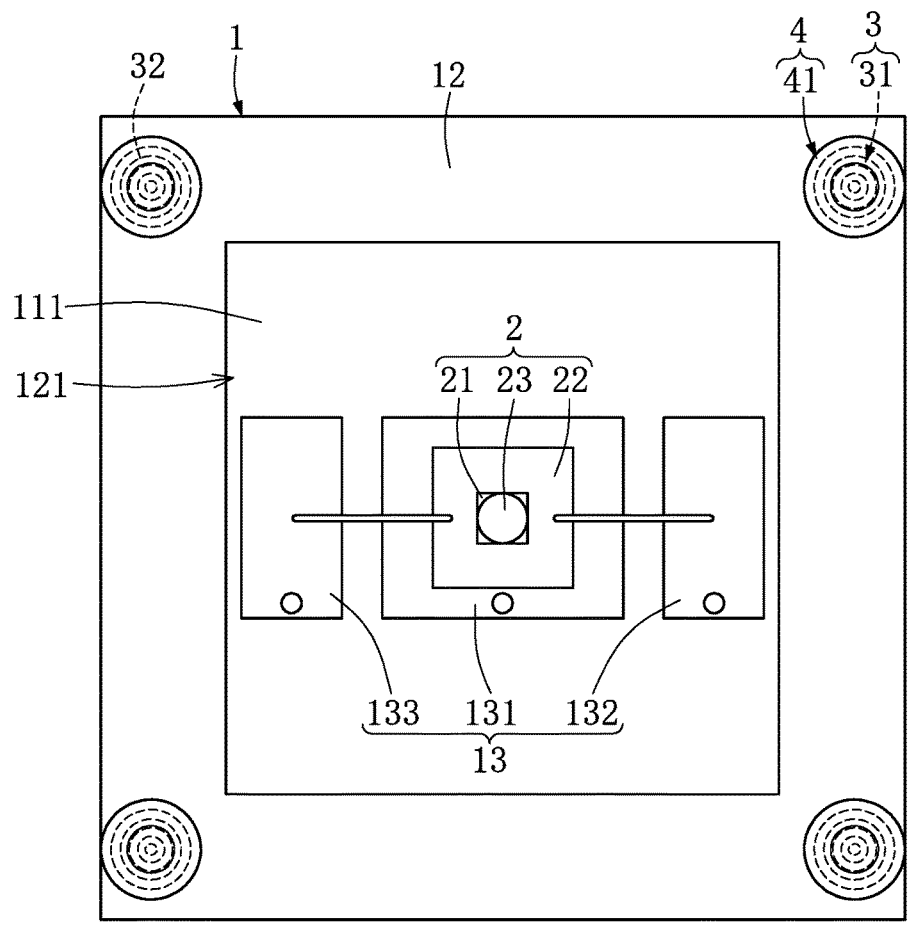
FIG. 4 is a top view of FIG. 1 as the cover is omitted.

As shown in FIGS. 2 through 5A, the base 1 includes a ceramic substrate 11, a ceramic board 12 integrally connected to the ceramic substrate 11 by using a Low-Temperature Co-fired Ceramics (LTCC) manner, a metallic layer 13, a soldering pad layer 14, and three conductive pillars 15 embedded in the ceramic substrate 11. As shown in FIGS. 3 and 4, the ceramic substrate 11 has a top surface 111 and a bottom surface 112. The ceramic board 12 has a thru-hole 121 for receiving the light-emitting unit 2, and an outer side surface of the ceramic board 12 is aligned with a side surface of the ceramic substrate 11. An inner side surface of the ceramic board 12 is provided for reflecting light emitted from the light-emitting unit 2.

The metallic layer 13 is disposed on the top surface 111 of the ceramic substrate 11 and is arranged in the thru-hole 121 of the ceramic board 12. The metallic layer 13 has a heat-dissipating pad 131 arranged at a center position of the top surface 111, a positive electrode pad 132, and a negative electrode pad 133. The positive electrode pad 132 and the negative electrode pad 133 are spaced apart from each other and respectively arranged at two opposite sides of the heat-dissipating pad 131.

Figure 5A:
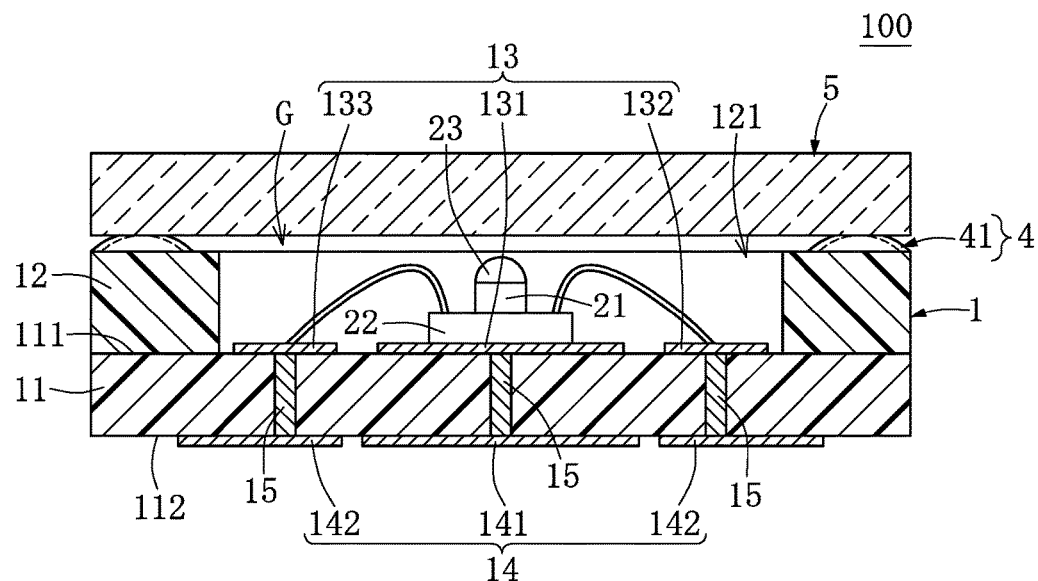
FIG. 5A is a cross-sectional view of FIG. 1 along line VA-VA.

As shown in FIGS. 2 and 5A, the soldering pad layer 14 is disposed on the bottom surface 112 of the ceramic substrate 11. The soldering pad layer 14 has a heat-dissipating soldering pad 141 arranged at a center position of the bottom surface 112 and two electrode soldering pads 142 respectively arranged at two opposite sides of the heat-dissipating soldering pad 141. The heat-dissipating soldering pad 141 and the electrode soldering pads 142 are elongated and parallel with each other. The heat-dissipating soldering pad 141 is arranged under the heat-dissipating pad 131, and the two electrode soldering pads 142 are respectively arranged under the positive electrode pad 132 and the negative electrode pad 133. Moreover, one end of each of the three conductive pillars 15 is respectively connected to the heat-dissipating pad 131, the positive electrode pad 132, and the negative electrode pad 133, and the other end of each of the three conductive pillars 15 is respectively connected to the heat-dissipating soldering pad 141 and the two electrode soldering pads 142.

As shown in FIGS. 3 and 4, the light-emitting unit 2 is disposed on the metallic layer 13 and is arranged in the thru-hole 121. The light-emitting unit 2 has an UV LED chip 21 and a submount 22. The UV LED chip 21 in the instant embodiment is a deep UV LED chip 21 having a wavelength smaller than 350 nm, and the UV LED chip 21 is a flip chip, but the instant disclosure is not limited thereto. For example, two electrodes of the UV LED chip 21 can be electrically connected to two electrodes of the submount 22 by wire bonding. In the instant embodiment, the UV LED chip 21 is disposed on the submount 22, and two electrodes (not shown) of the UV LED chip 21 are electrically connected to two electrodes (not shown) of the submount 22 in a flip chip manner. The submount 22 is disposed on the heat-dissipating pad 131 of the metallic layer 13, and the two electrodes of the submount 22 are electrically connected to the positive electrode pad 132 and the negative electrode pad 133 by wire bonding. The UV LED chip 21 can be replaced by a different kind of LED chip, such as a red LED chip, a green LED chip, a blue LED chip, or an infrared LED chip. The submount 22 is selectively provided according to what kind of the LED chip is chosen.

In a non-shown embodiment, the heat-dissipating pad 131 can be omitted, the light-emitting unit 2 is disposed on the ceramic substrate 11, the positive electrode pad 132 and the negative electrode pad 133 are respectively arranged at two opposite sides of the light-emitting unit 2, and two electrodes of the submount 22 are electrically connected to the positive electrode pad 132 and the negative electrode pad 133 by wire bonding.

In addition, the LED package structure 100 further comprises a die-attaching adhesive (not shown), and the light-emitting unit 2 can be bonded on the base 1 by the die-attaching adhesive. In the instant embodiment, the die-attaching adhesive is a nano-silver paste, the nano-silver paste is made of nano-silver powders without epoxy resin, and a volume percentage of the nano-silver powders of the nano-silver paste is about 85~90%, thereby the die-attaching adhesive has good thermal resistance and a degradation problem is not easily occurred. Moreover, when the nano-silver powders have particle size smaller than 20 nm, the nano-silver powders having a weight percentage of 20~35% are provided for the nano-silver paste. When the nano-silver powders have particle size of 20~100 nm, the nano-silver powers having a weight percentage of 40~50% are provided for the nano-silver paste. When the nano-silver powders have particle size of 300 nm~2 μm, the nano-silver powers having a weight percentage of 10~20% are provided for the nano-silver paste. A binder being Isobornyl Cyclohexanol (IBCH) is provided with a weight percentage of 2~7%; a solution being 1-decanol is provided with a weight percentage of 5~15%. The chemical formula of the nano-silver paste is nAg-m(AgOOCR-l(AgOR), R=[CH3(CH2)x], and l, m, n, x are positive integers.

Figure 5B:
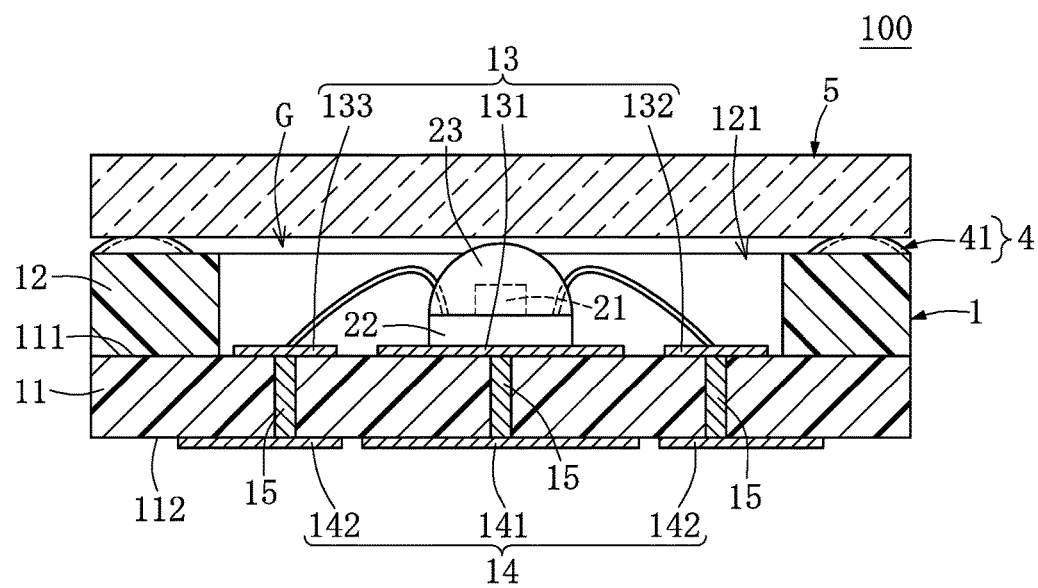
FIG. 5B is a cross-sectional view showing a variety of FIG. 5A.
Figure 8:
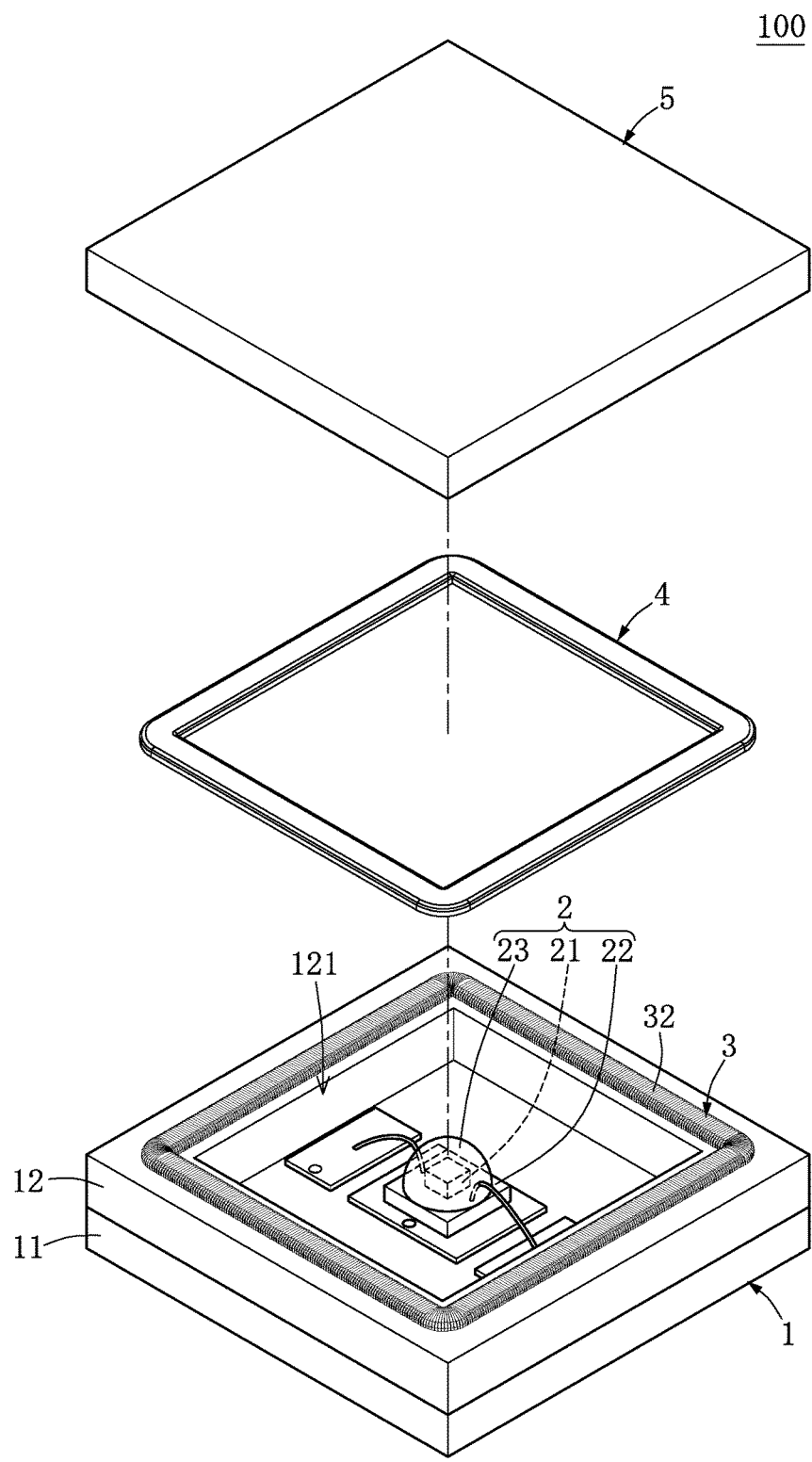
FIG. 8 is an exploded view showing a variety of the first embodiment.

Moreover, the light-emitting unit 2 in the instant embodiment can be provided with a lens 23. The lens 23 is disposed on a light-emitting surface of the UV LED chip 21 (as shown in FIGS. 4 and 5A), or the lens 23 is disposed on the submount 22 to encapsulate the UV LED chip 21. That is to say, the UV LED chip 21 is embedded in the lens 23 (as shown in FIG. 5B or 8).

Figure 6:
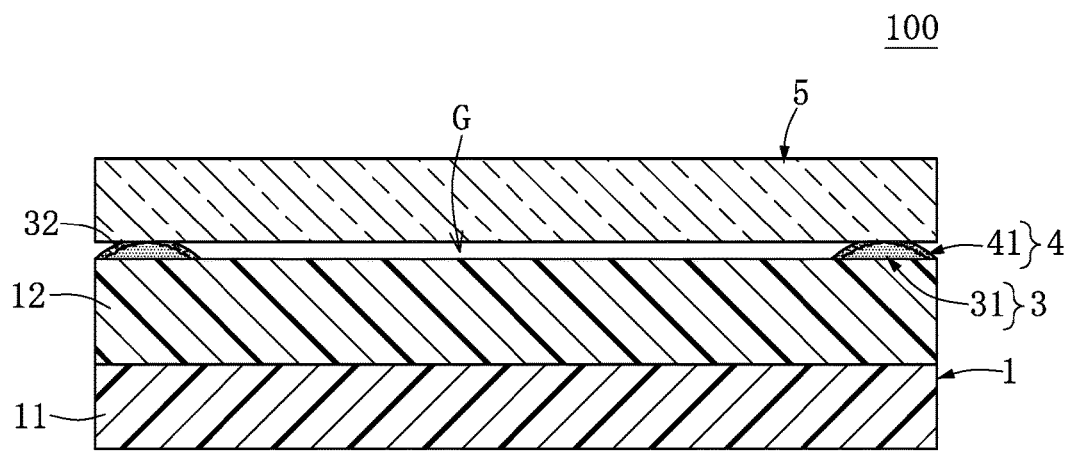
FIG. 6 is a cross-sectional view of FIG. 1 along line VI-VI.

As shown in FIGS. 3, 4, and 6, each of the first adhesive layer 3 and the second adhesive layer 4 can be a heat curable resin or an UV curable resin. In the instant embodiment, each of the first adhesive layer 3 and the second adhesive layer 4 is an UV curable silicone resin, but the instant disclosure is not limited thereto. Moreover, the first adhesive layer 3 disposed on the ceramic board 12 is cured firstly, and then the second adhesive layer 4 is provided to stack on the first adhesive layer 3. Furthermore, the first adhesive layer 3 is covered by the second adhesive layer 4.

Figure 7:
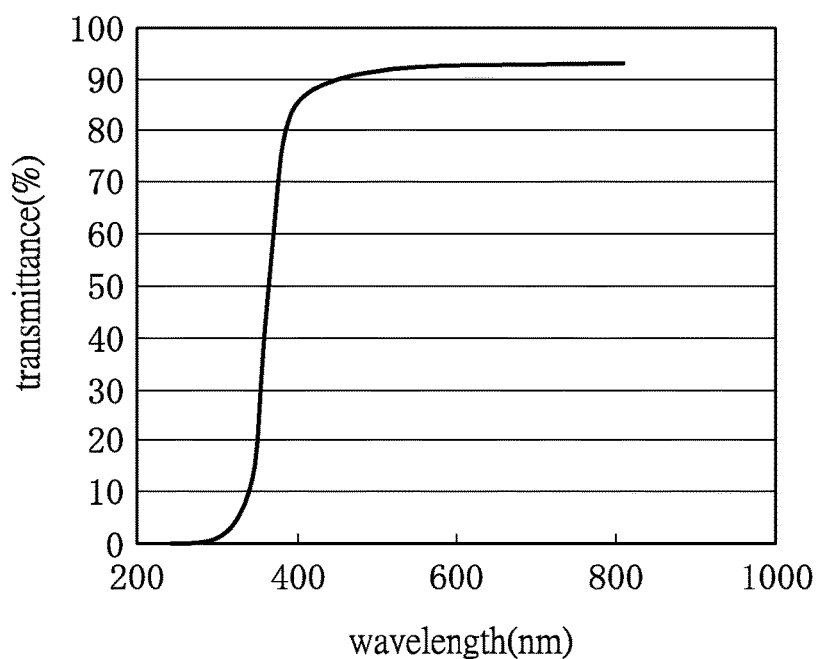
FIG. 7 is a diagram showing the light transmittance of UV curable silicone resin with respect to light with different wavelength.

The property of the UV curable silicone resin of the instant embodiment is shown in the following chart, and the light transmittance of the UV curable silicone resin with respect to light with different wavelength is shown in FIG. 7.

| | parameter | UV curable silicone resin |
|---|---|---|
| before curing | appearance | transparent |
| | viscosity at 25° C. mPa • s | 2600 |
| after curing | refractive index | 1.43 |
| | hardness (Shore D) | 70 |
| | flexural modulus N/mm$^2$ | 470 |
| | bending strength N/mm$^2$ | 14 |
| | light transmittance (400 nm/2 mm) % | 86.4 |

The construction of the first adhesive layer 3 and the second adhesive layer 4 can be approximately classified to a non-sealed type (as shown in FIG. 3) and a sealed type (as shown in FIG. 8).

Please refer to FIGS. 3 and 6, which show the non-sealed type LED package structure 100. At least one gap G is formed between the ceramic board 12 of the base 1 and the cover 5, and an inner space of the LED package structure 100 can be in air communication with an outer space via the gap G Specifically, the first adhesive layer 3 has a plurality of first adhesive portions 31 respectively distributed at the corners of the ceramic board 12. The second adhesive layer 4 has a plurality of second adhesive portions 41 disposed on the ceramic board 12 and respectively covering the first adhesive portions 31. A surface of each of the first adhesive portions 31 connected to the corresponding second adhesive portion 41 is a ripple surface 32, and the ripple surface 32 can be also regarded as a step-shaped or wave-shaped surface. Specifically, the ripple surface 32 has a plurality of round edges in an approximately concentric arrangement, but the instant disclosure is not limited thereto. Thus, the bonding force between the first adhesive layer 3 and the second adhesive layer 4 is increased by forming the ripple surface 32 of each first adhesive portion 31. Compared to the conventional single adhesive layer, the shearing force of the LED package structure 100 of the instant embodiment is increased at least 18.6% by the use of the first adhesive layer 3 and the second adhesive layer 4 according to a related experiment.

Figure 9:
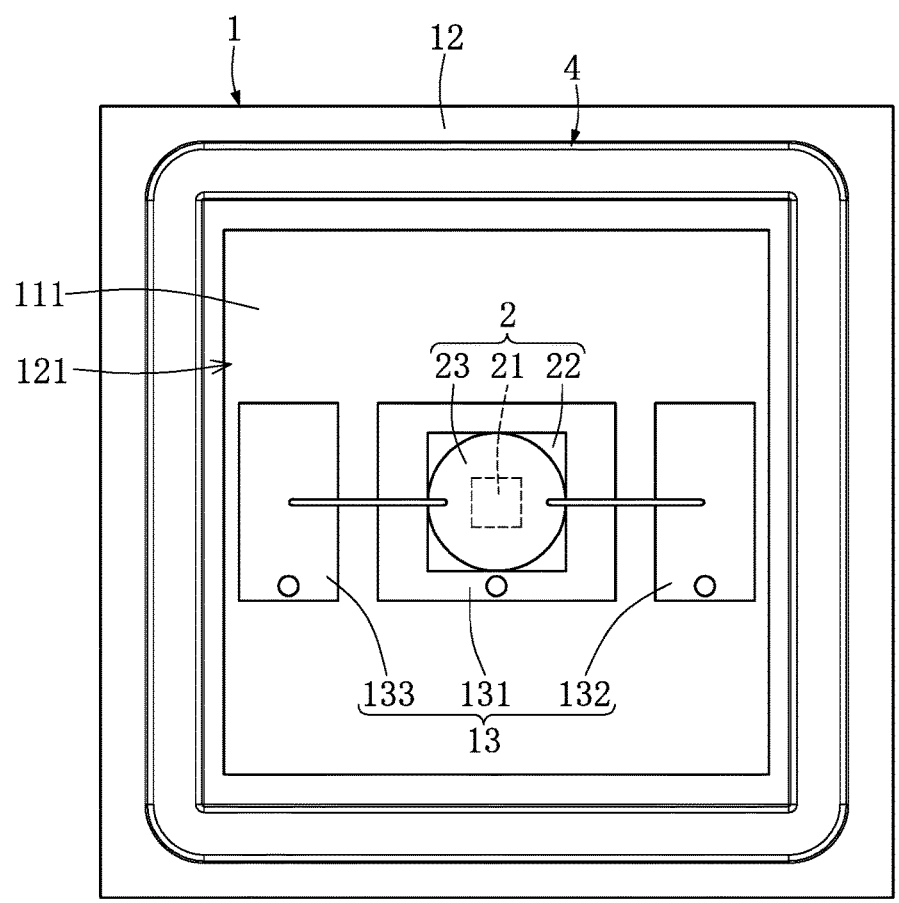
FIG. 9 is a top view of FIG. 8 as the cover is omitted.
Figure 10:
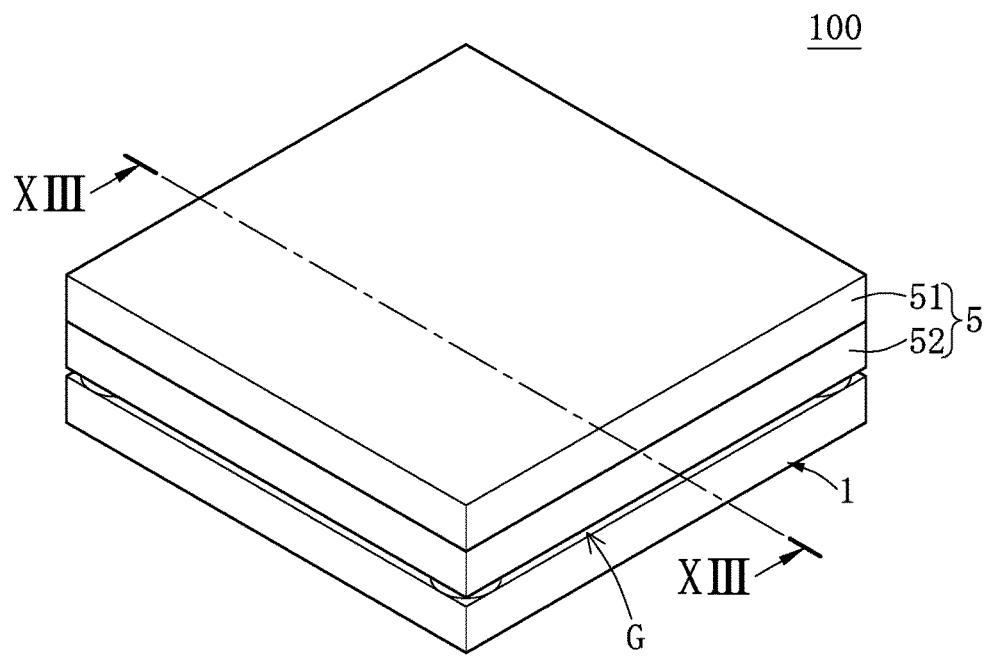
FIG. 10 is a perspective view showing the LED package structure according to a second embodiment of the instant disclosure.
Figure 11:
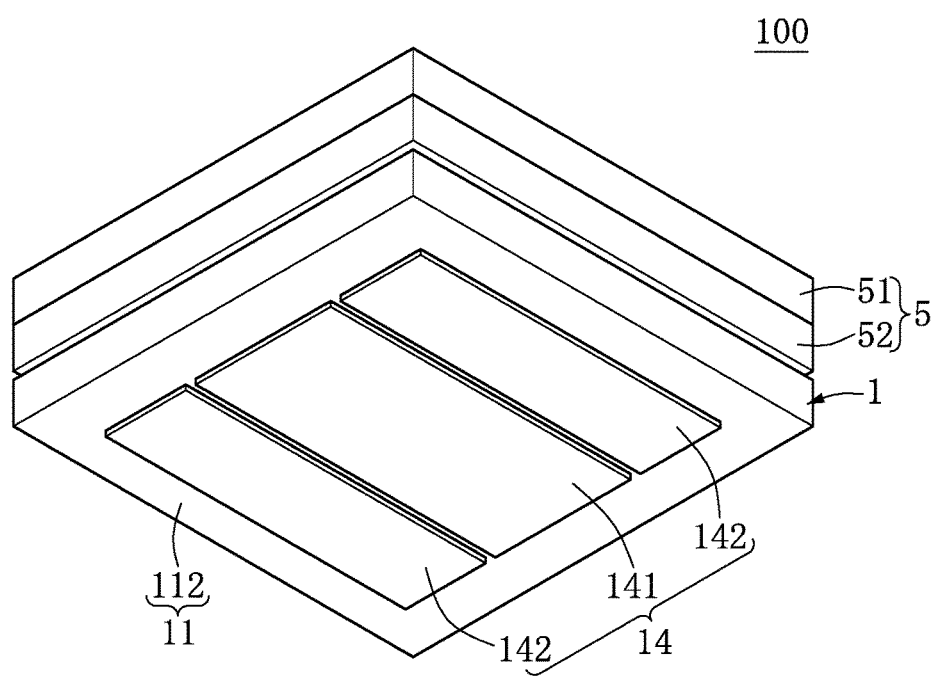
FIG. 11 is a perspective view of FIG. 10 from another perspective.

Please refer to FIGS. 8 and 9, which show the sealed type LED package structure 100. The ceramic board 12 of the base 1 and the cover 5 are provided without any gap there-between by using the first adhesive layer 3 and the second adhesive layer 4, and an inner space of the LED package structure 100 is isolated from an outer space. Specifically, the first adhesive layer 3 having a ring shape is disposed on the ceramic board 12. The second adhesive layer 4 having a ring shape is disposed on the ceramic board 12 and covers the first adhesive layer 3. A surface of the first adhesive layer 3 connected to the second adhesive layer 4 is a ripple surface 32, and the ripple surface 32 can be also regarded as a step-shaped or wave-shaped surface. Thus, the bonding force between the first adhesive layer 3 and the second adhesive layer 4 is increased by forming the ripple surface 32 of the first adhesive layer 3. Compared to the conventional single adhesive layer, the shearing force of the LED package structure 100 of the instant embodiment is increased at least 37.1% by having the first adhesive layer 3 and the second adhesive layer 4 according to a related experiment.

As shown in FIGS. 5A and 6, the cover 5 is adhered to the second adhesive layer 4 to protect the light-emitting unit 2, and the cover 5 can be adhered to the first adhesive layer 3 and the second adhesive layer 4 at the same time. The cover 5 in the instant embodiment is a translucent covering plate, but the cover 5 is not limited thereto. For example, a coating layer (not shown) can be formed on the cover 5 to increase light transmittance, or the cover 5 can be a hemispherical construction (not shown) to adjust a light shape. Moreover, when the light-emitting unit 2 has an UVA LED chip 21, the LED package structure 100 needs to have a plate-like cover 5 made of silica (e.g., glass or quartz). When the light-emitting unit 2 has an UVA LED chip 21 or UVC LED chip 21, the LED package structure 100 needs to have a plate-like cover 5 made of silica (e.g., glass or quartz), and two coating layers are respectively formed on two opposite surfaces of the cover 5. When the light-emitting unit 2 has a UVC LED chip 21, the cover 5 is can also be a hemispherical lens made of silica (e.g., glass or quartz), and a coating layer is selectively formed on the surface of the lens.

[Second Embodiment]

Please refer to FIGS. 10 through 16, which show a second embodiment. The second embodiment is similar to the first embodiment, and the identical features are not disclosed again. The different features between the two embodiments are the construction of the base 1, the construction of the cover 5, the first adhesive layer 3 being an UV curable resin, and the second adhesive layer 4 being a heat curable resin.

As shown in FIGS. 10 through 14, the base 1 in the instant embodiment includes a plate-like ceramic substrate 11, a metallic layer 13 disposed on the top surface 111 of the ceramic substrate 11, a soldering pad layer 14 disposed on the bottom surface 112 of the ceramic substrate 11, and three conductive pillars 15 embedded in the ceramic substrate 11. An outer ring-shaped portion of the top surface 111 is defined as a bonding region 1111, and the metallic layer 13 is disposed on an inner portion of the top surface 111 arranged inside the bonding region 1111.

The cover 5 in the instant embodiment includes a translucent covering plate 51 and a ring-shaped frame 52 connected to the covering plate 51. An end of the frame 52 away from the covering plate 51 is fixed on the second adhesive layer 4. The covering plate 51 in the instant embodiment is approximately identical to that of the first embodiment. The frame 52 is made of a reflecting material (e.g., metal). An inner surface of the frame 52 is formed as a reflecting surface 521, and a space surroundingly defined by the reflecting surface 521 has a trapezoid cross-section. A top edge of the trapezoid cross-section is longer than a bottom edge of the trapezoid cross-section. An angle between the reflecting surface 521 and the bottom surface of the covering plate 51 in the instant embodiment is 54.7±10 degrees, and is preferably 54.7 degrees, but the angle is not limited thereto.

Figure 13:
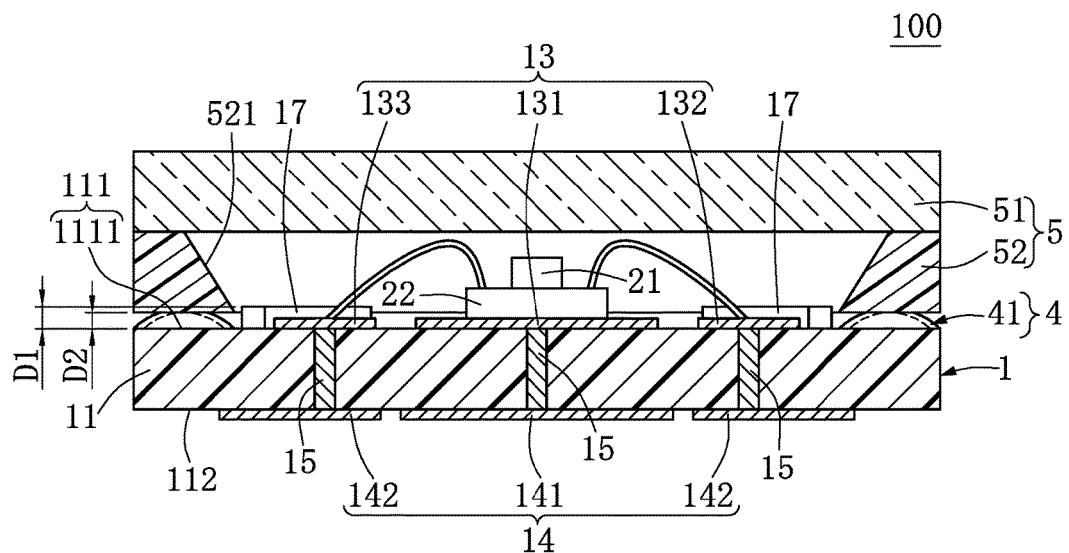
FIG. 13 is a cross-sectional view of FIG. 10 along line XIII-XIII.
Figure 14:
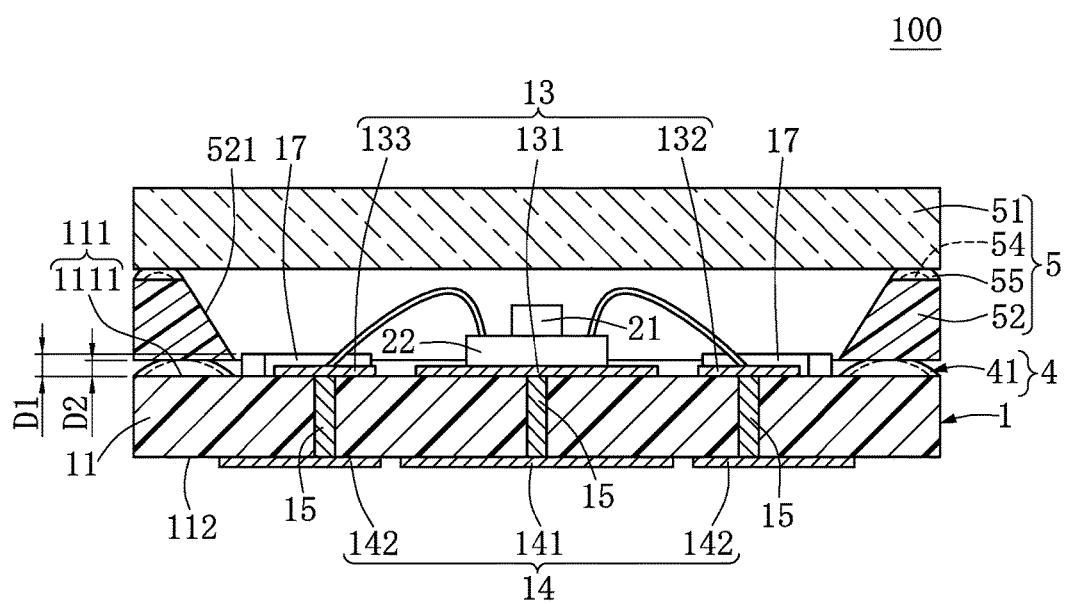
FIG. 14 is a cross-sectional view showing the connection between the covering plate and the frame by using a third adhesive layer and a fourth adhesive layer.

The connection of the covering plate 51 and the frame 52 can be implemented by using a hot-melt manner (as shown in FIG. 13) or adhering manner (as shown in FIG. 14). Specifically, as shown in FIG. 14, the cover 5 further has a third adhesive layer 54 and a fourth adhesive layer 55. The third adhesive layer 54 is disposed on one of two adjacent surfaces of the covering plate 51 and the frame 52, and the fourth adhesive layer 55 is disposed on the other of the two adjacent surfaces of the covering plate 51 and the frame 52 and covers the third adhesive layer 54. In other words, the material and the cooperated features of the third adhesive layer 54 and the fourth adhesive layer 55 are similar to that of the first adhesive layer 3 and the second adhesive layer 4.

Figure 15:
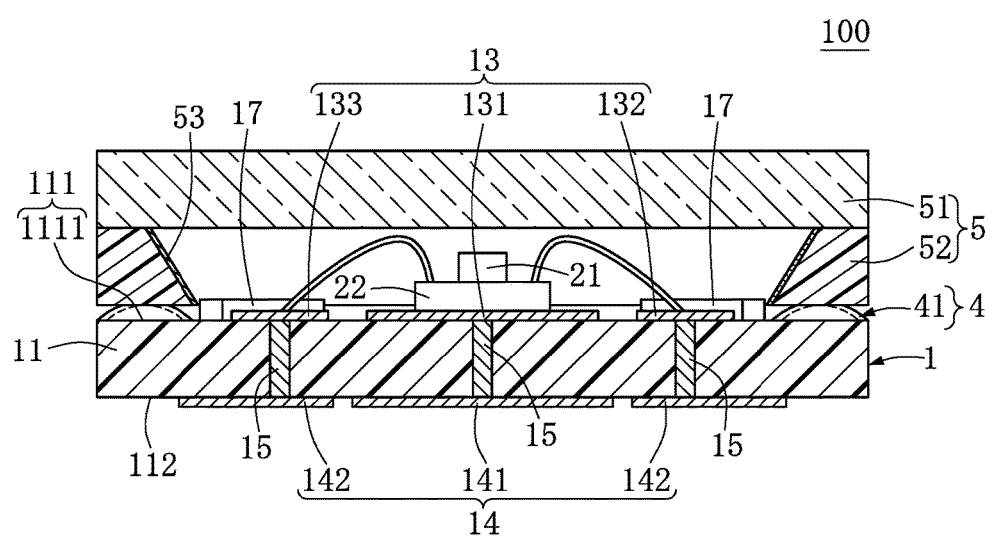
FIG. 15 is a cross-sectional view showing a reflecting layer formed on the inner surface of the frame.

As shown in FIG. 15, the frame 52 can be made of a non-reflecting and non-translucent material (e.g., silicon), and a reflecting material (e.g., aluminum) is selectively formed on an inner surface of the frame 52 to form a reflecting layer 53. A space surroundingly defined by the reflecting layer 53 has a trapezoid cross-section. A top edge of the trapezoid cross-section is longer than a bottom edge of the trapezoid cross-section. An angle between the reflecting layer 53 and the bottom surface of the covering plate 51 in the instant embodiment is 54.7±10 degrees, and is preferably 54.7 degrees, but the angle is not limited thereto.

Figure 12:
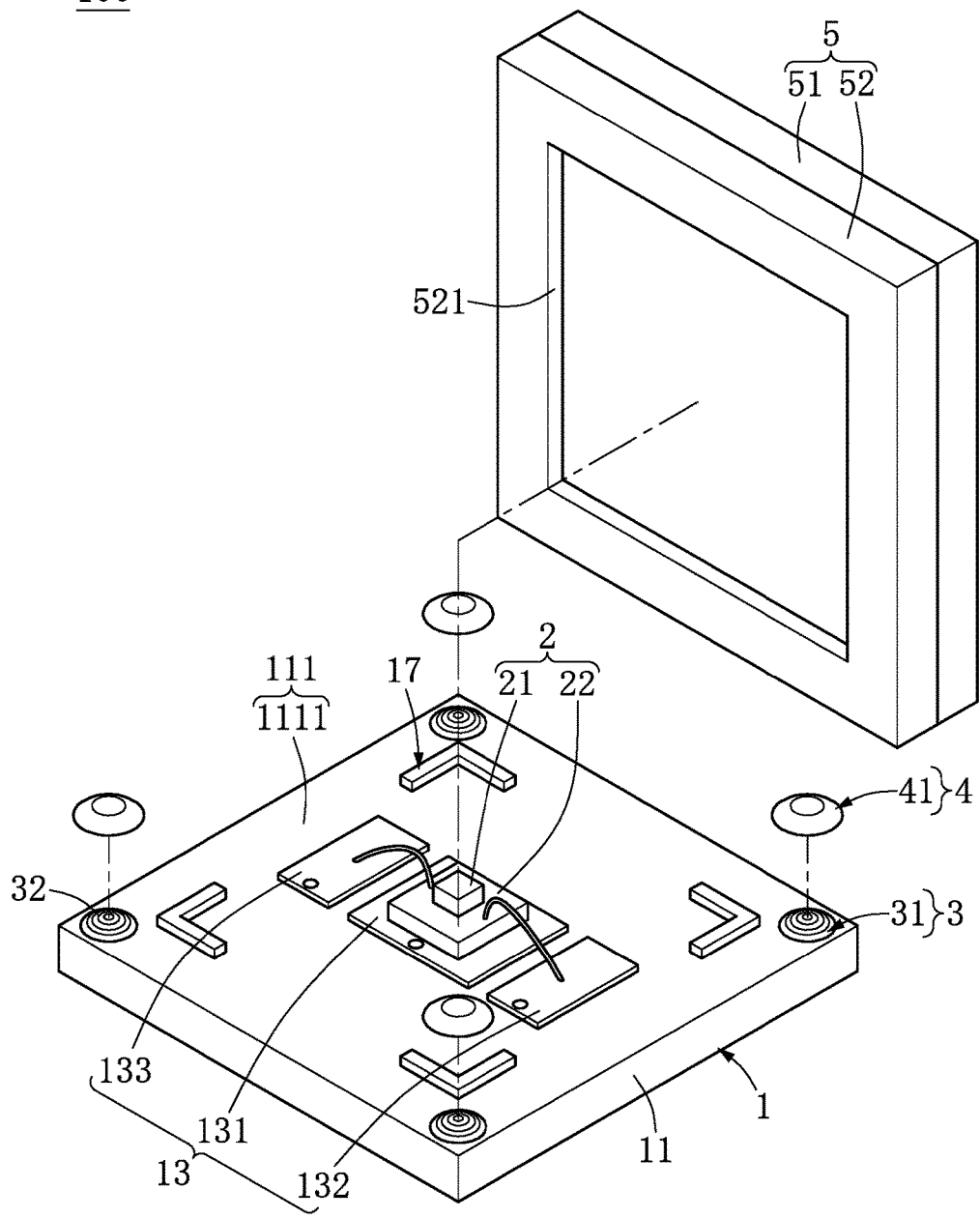
FIG. 12 is an exploded view of FIG. 10.

In addition, as shown in FIGS. 12 and 13, the base 1 further includes at least one light-shielding portion 17 disposed on the top surface 111 inside the bonding region 1111, and the light-shielding portion 17 is arranged adjacent to the first adhesive layer 3 and the second adhesive layer 4. A height D1 of the light-shielding portion 17 is greater than or identical to a total height D2 of the first adhesive layer 3 and the second adhesive layer 4, so that the light-shielding portion 17 blocks light emitted from the UV LED chip 21 toward the first adhesive layer 3 and the second adhesive layer 4, thereby preventing a degradation problem from occurring to the first adhesive layer 3 and the second adhesive layer 4. Moreover, the light-shielding portion 17 and the metallic layer 13 can be formed together, that is to say, the material and the thickness of the light-shielding portion 17 are identical to that of the metallic layer 13, but the instant disclosure is not limited thereto.

Figure 16:
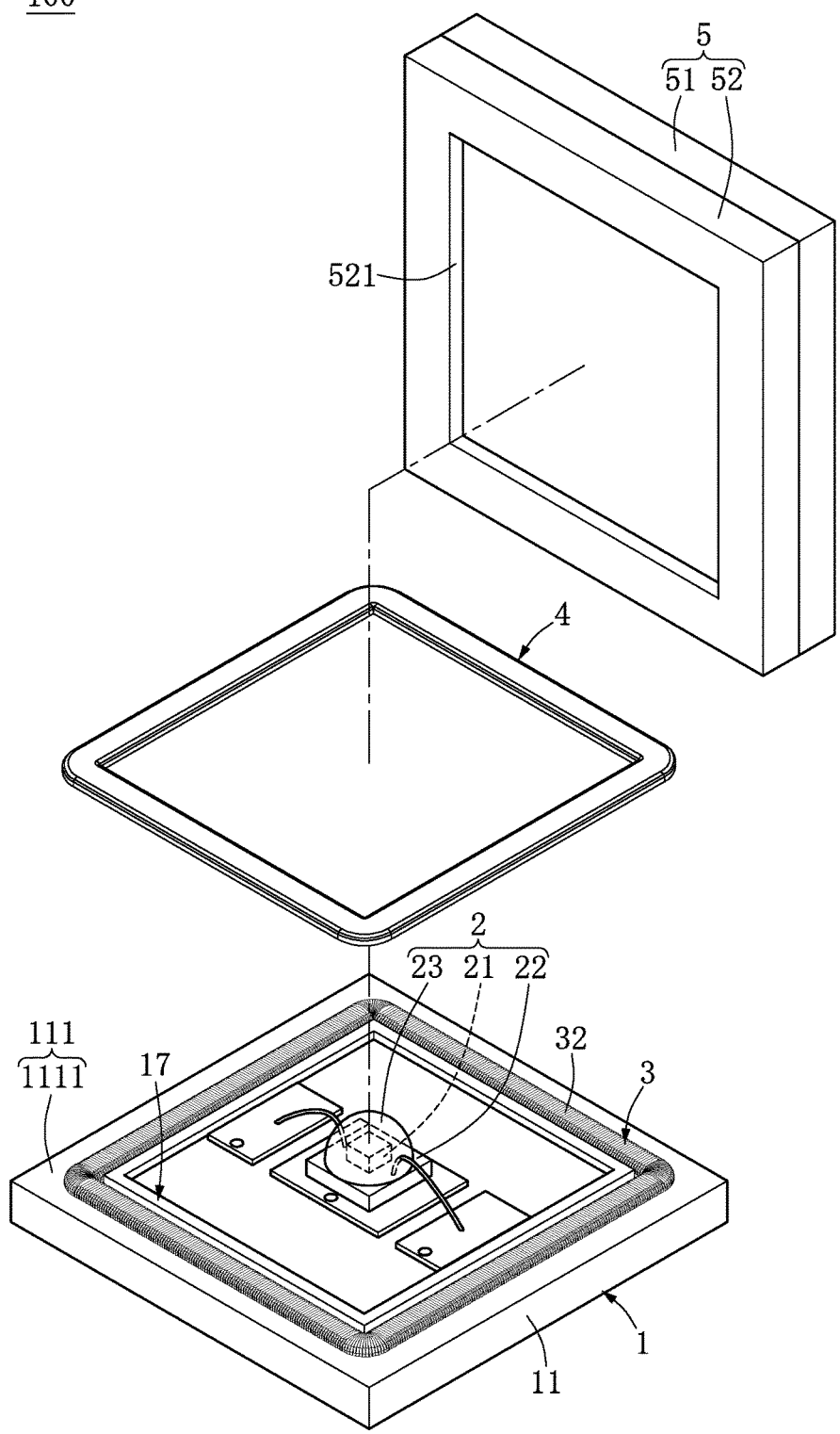
FIG. 16 is an exploded view showing a variety of the second embodiment.
Figure 17:
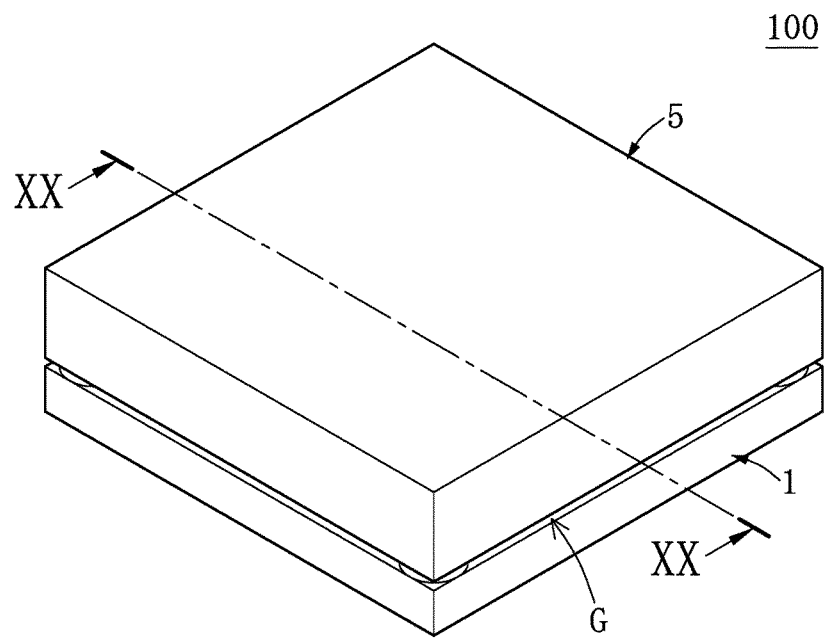
FIG. 17 is a perspective view showing the LED package structure according to a third embodiment of the instant disclosure.
Figure 18:
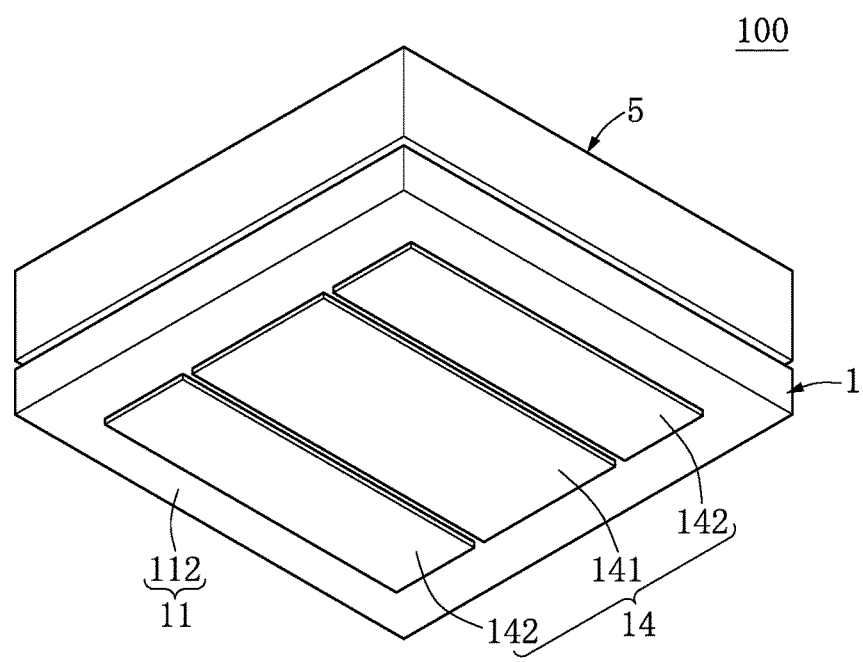
FIG. 18 is a perspective view of FIG. 17 from another perspective.
Figure 19:
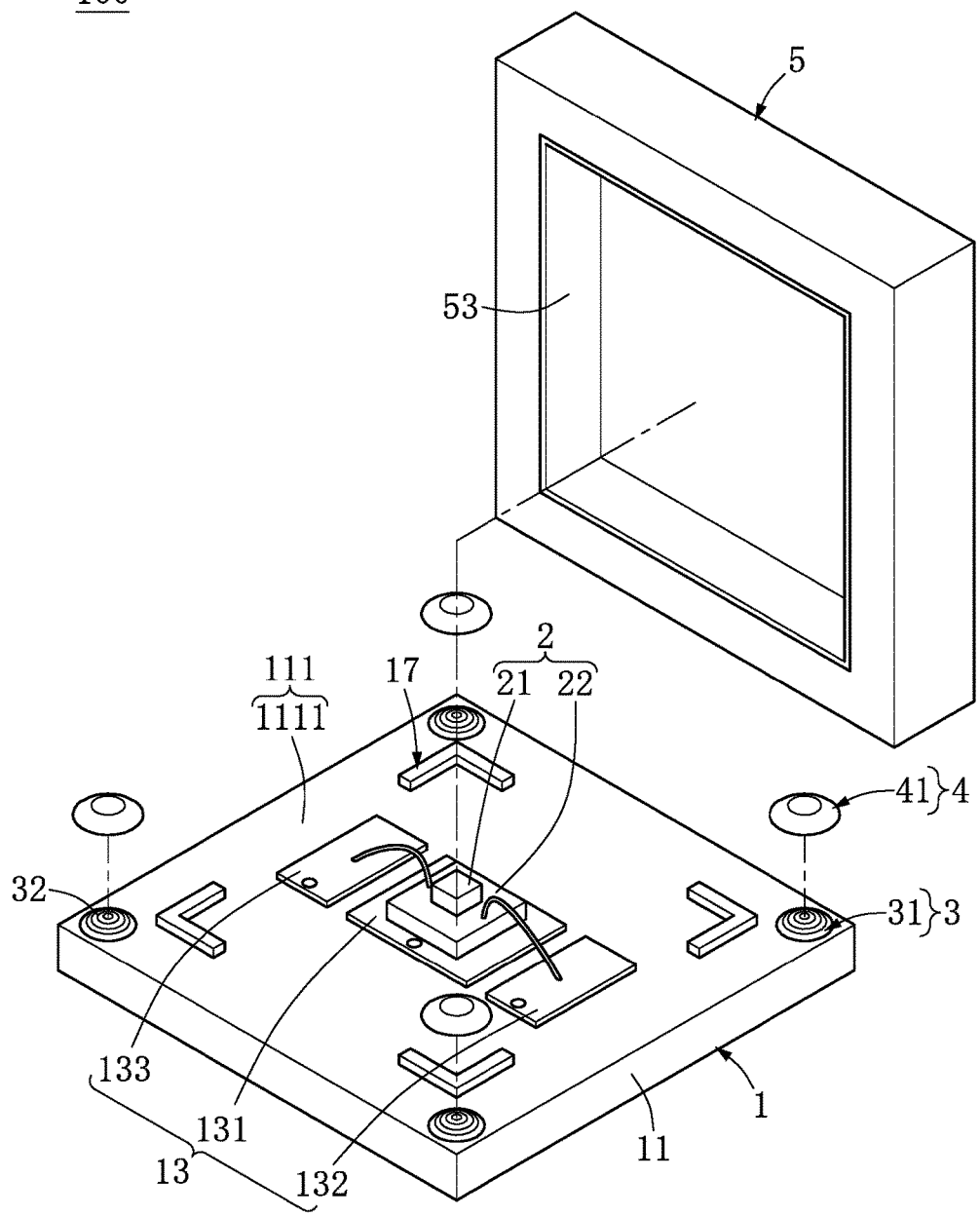
FIG. 19 is an exploded view of FIG. 17.
Figure 20:
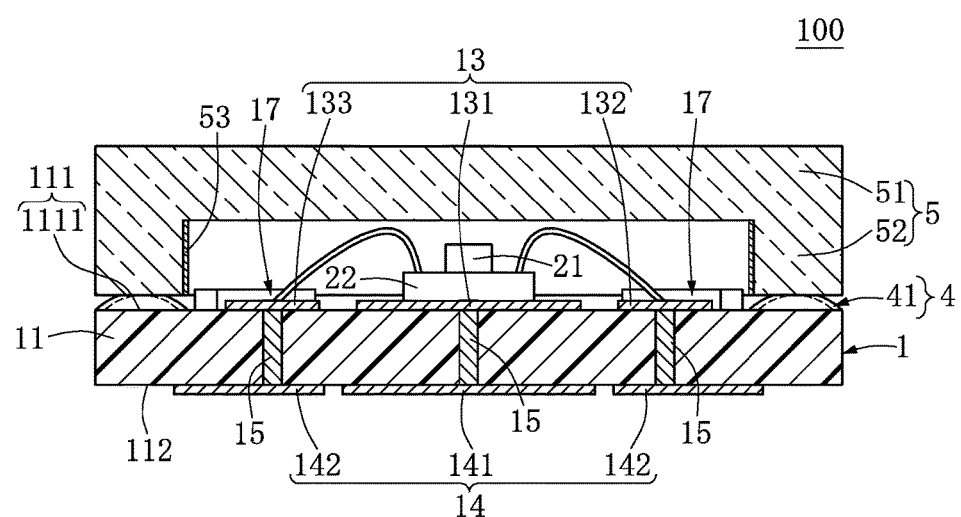
FIG. 20 is a cross-sectional view of FIG. 17 along line XX-XX.
Figure 21:
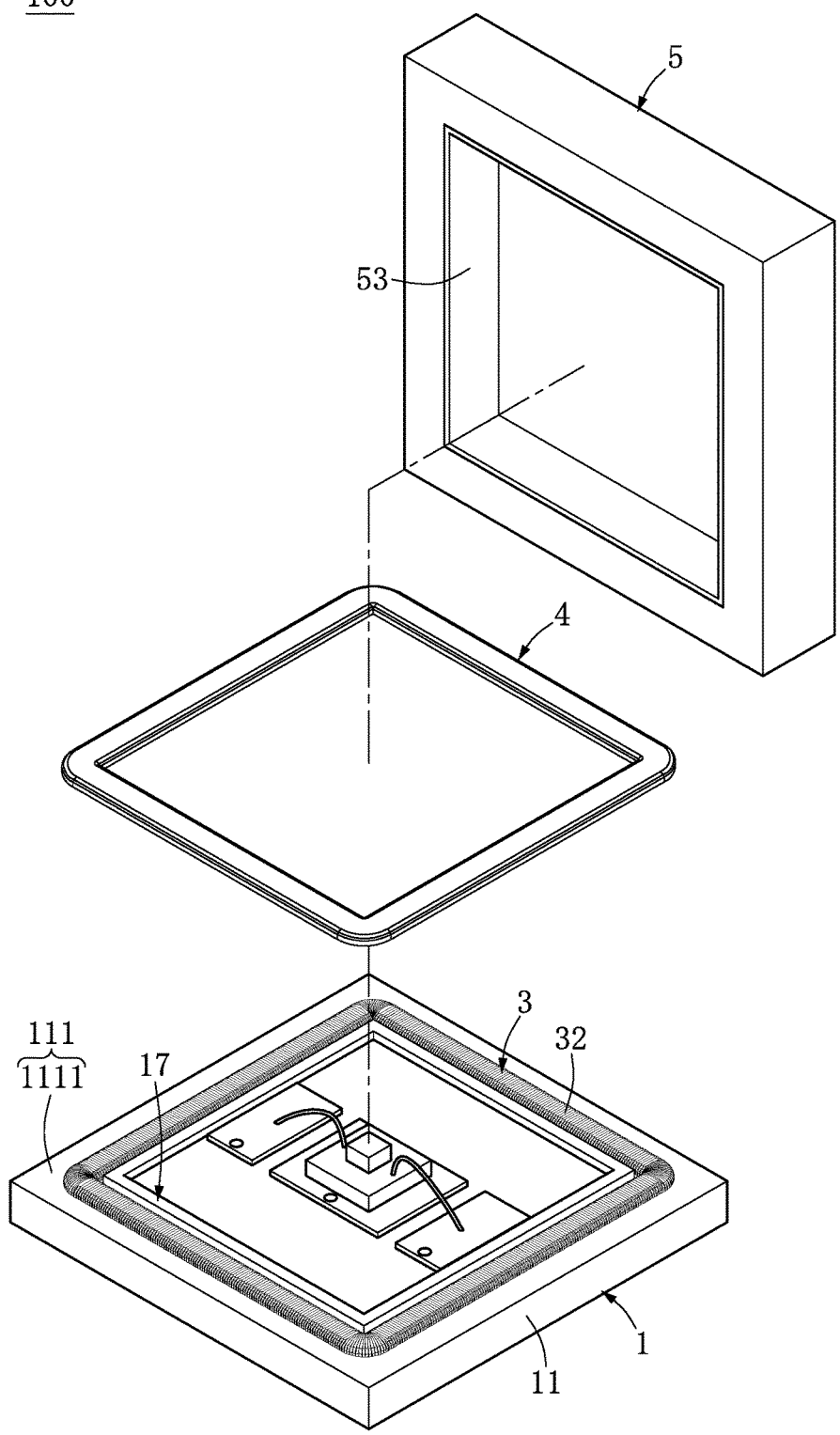
FIG. 21 is an exploded view showing a variety of the third embodiment.

The shape and the position of the light-shielding portion 17 in the instant embodiment corresponds to the shape and the position of the first adhesive layer 3 and the second adhesive layer 4. As shown in FIG. 12, each of the light-shielding portions 17 is approximately an L-shape for shielding the first adhesive layer 3 and the second adhesive layer 4. As shown in FIG. 16, the light-shielding portion 17 is approximately a ring-shape for shielding the first adhesive layer 3 and the second adhesive layer 4.

[Third Embodiment]

Please refer to FIGS. 17 through 21, which show a third embodiment. The third embodiment is similar to the second embodiment, and the identical features are not disclosed again. The different feature between the two embodiments is the construction of the cover 5. Specifically, the covering plate 51 and the frame 52 in the instant embodiment are integrally formed in one piece and are made of a translucent material (e.g., silica). The first adhesive layer 3 is an UV curable resin, and the second adhesive layer 4 is a heat curable resin. A reflecting material (e.g., aluminum) is selectively formed on an inner side surface of the frame 52 to form a reflecting layer 53, and the reflecting layer 53 is approximately a square ring-shape or a rectangular ring-shape. In the instant embodiment, an angle between the bottom surface of the covering plate 51 and the inner side surface of the frame 52 is approximately 90 degrees, but the angle is not limited thereto.

In another embodiment, the covering plate 51 and the frame 52 are not integrally formed and are made of a translucent material (e.g., silica). The first adhesive layer 3 is an UV curable resin, and the second adhesive layer 4 is a heat curable resin or an UV curable resin. A reflecting material (e.g., aluminum) is selectively formed on an inner surface of the frame 52 to form a reflecting layer 53, and the reflecting layer 53 is approximately a square ring-shape or a rectangular ring-shape. An angle between the covering plate 51 and the frame 52 is approximately 90 degrees, but the angle is not limited thereto.

In addition, the light-emitting unit 2 in the instant embodiment can further include a lens (not shown), which is similar to the first embodiment. The lens is disposed on a light-emitting surface of the UV LED chip 21 (similar to FIGS. 4 and 5A), or the lens is disposed on the submount 22 to encapsulate the UV LED chip 21. That is to say, the UV LED chip 21 is embedded in the lens (similar to FIG. 5B or 8).

[Fourth Embodiment]

Figure 22:
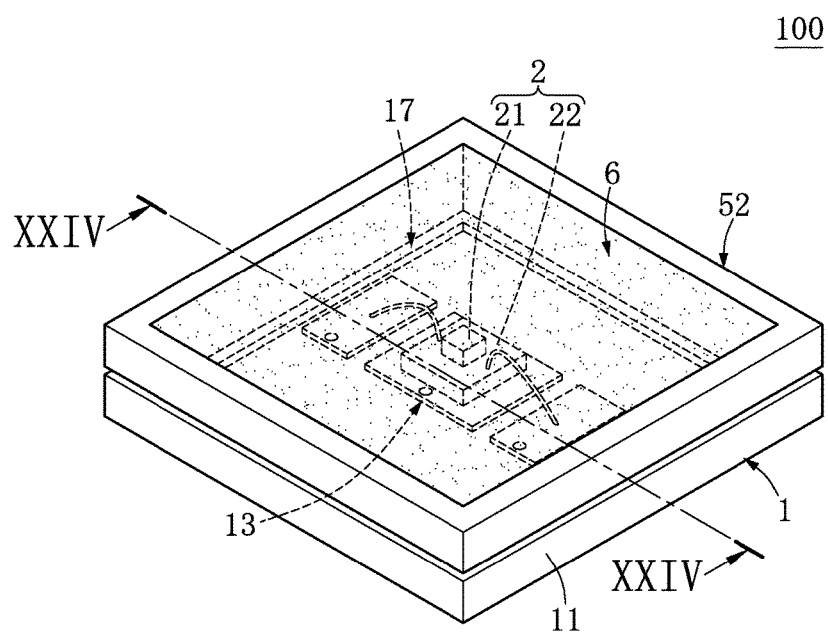
FIG. 22 is a perspective view showing the LED package structure according to a fourth embodiment of the instant disclosure.
Figure 23:
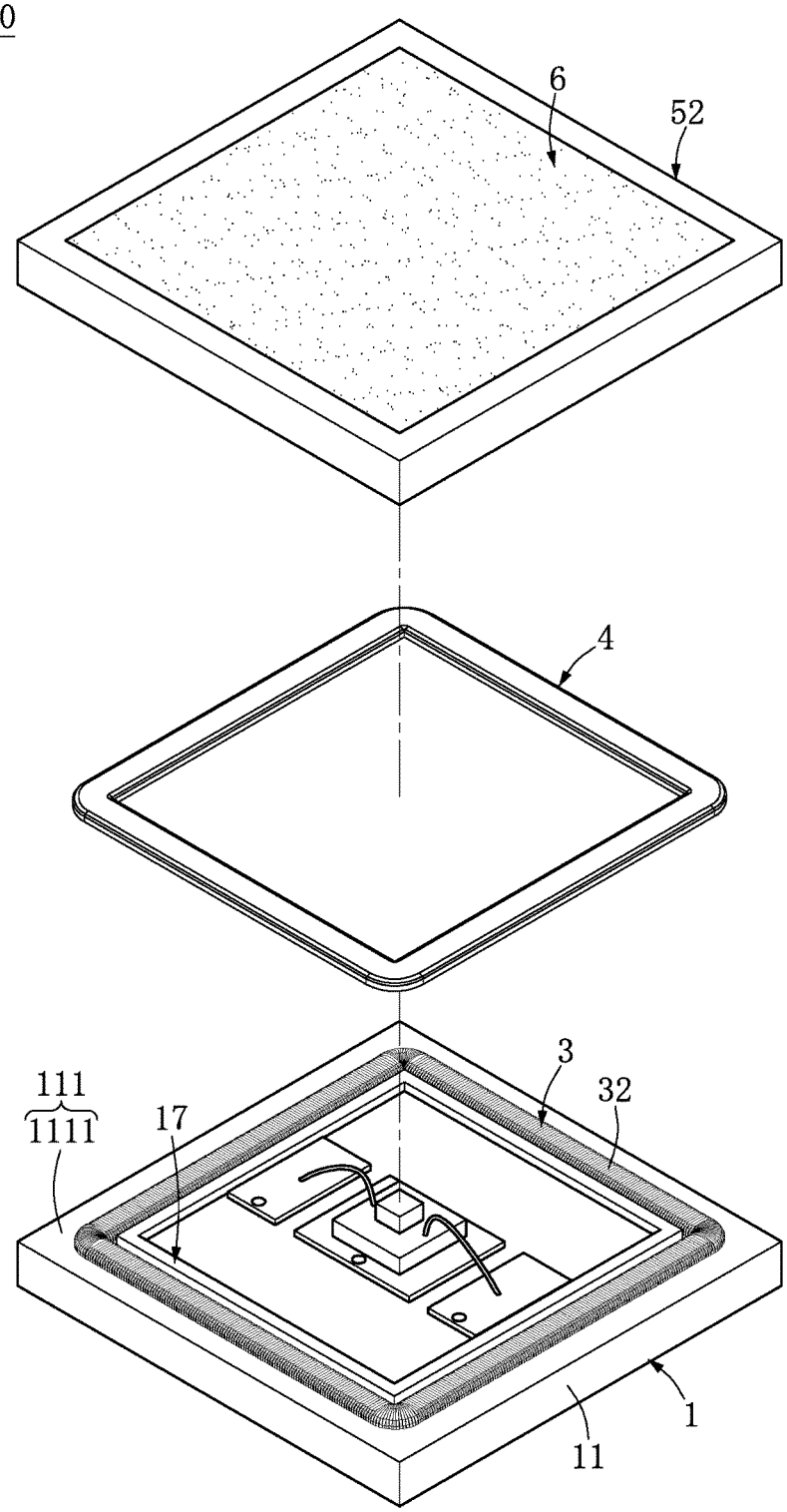
FIG. 23 is an exploded view of FIG. 22.
Figure 24:
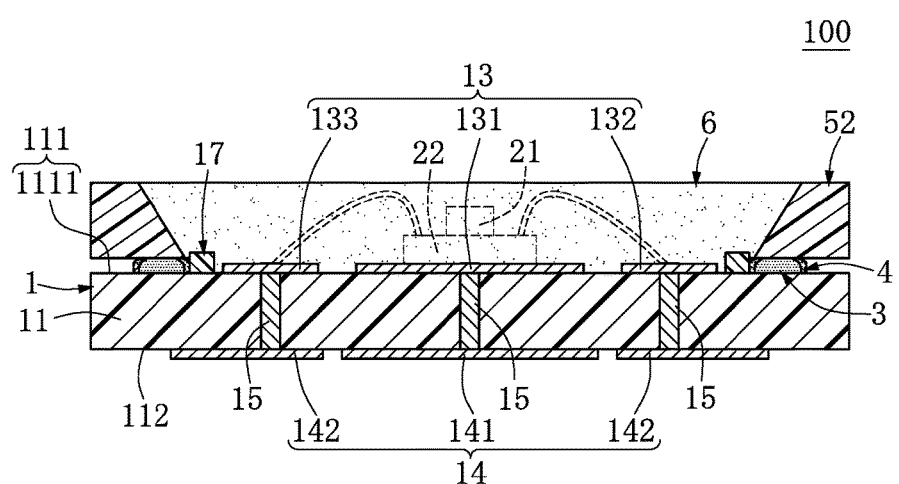
FIG. 24 is a cross-sectional view of FIG. 22 along line XXIV-XXIV.

Please refer to FIGS. 22 through 24, which show a fourth embodiment. The fourth embodiment is similar to the second embodiment, and the identical features are not disclosed again. The different features between the two embodiments are that the cover 5 of the instant embodiment only has the frame 52, the first adhesive layer 3 and the second adhesive layer 4 are the sealed type, and the LED package structure 100 of the instant embodiment further includes an encapsulation body 6.

Specifically, the encapsulation body 6 is filled in a space co-defined by the frame 52 and the ceramic substrate 11, so the light-emitting unit 2, the metallic layer 3, and the light-shielding portion 17 are embedded in the encapsulation body 6. The encapsulation body 6 in the instant embodiment is made of fluoropolymer or PDMS, and the property of the fluoropolymer is shown in the following chart.

| | parameter |
|---|---|
| glass transition temperature(Tg) | >250° C. |
| density | 1.28 |
| light transmittance | 60% (280 nm) |
| refraction index | 1.38 (589 nm) |
| chemical formula | $H_3C-\underset{\underset{CH_3}{\mid}}{\overset{\overset{CH_3}{\mid}}{Si}}-O-\left[\underset{\underset{CH_3}{\mid}}{\overset{\overset{CF_3}{\underset{\mid}{\overset{\mid}{CH_2}}\underset{\mid}{\overset{\mid}{CH_2}}}}{Si}}-O\right]_n-\underset{\underset{CH_3}{\mid}}{\overset{\overset{CH_3}{\mid}}{Si}}-CH_3$ |

Thus, the encapsulation body 6 is made of fluoropolymer, so the encapsulation body 6 has a strong bonding energy for resisting UV light emitted from the UV LED chip 21 due to the carbon-fluorine bonding.

In addition, the cover 5 can be provided with the covering plate 51 covering the top edge of the frame 52 and the top surface of the encapsulation body 6, thereby protecting the encapsulation body 6.

[The Possible Effect of the Instant Embodiments]

In summary, the second adhesive layer of the LED package structure of the instant disclosure is formed at a predetermined position by the bonding force of the first adhesive layer and the second adhesive layer, such that the cover is disposed on the base through the first and the second adhesive layers stably. Compared to the conventional single adhesive layer, the shearing force of the LED package structure of the instant disclosure is effectively increased by the cooperation of the first adhesive layer and the second adhesive layer.

Specifically, when the first adhesive layer and the second adhesive layer are applied to the non-sealed type, the shearing force of the LED package structure of the instant disclosure is increased at least 18.6% comparing to the conventional single adhesive layer by the cooperation of the first adhesive layer and the second adhesive layer. When the first adhesive layer and the second adhesive layer are applied to the sealed type, the shearing force of the LED package structure of the instant disclosure is increased at least 37.1% comparing to the conventional single adhesive layer by the cooperation of the first adhesive layer and the second adhesive layer.

Moreover, the LED package structure can be provided with the light-shielding portion for blocking light emitted from the UV LED chip toward the first adhesive layer and the second adhesive layer, thereby preventing a degradation problem from occurring to the first adhesive layer and the second adhesive layer.

The descriptions illustrated supra set forth simply the preferred embodiments of the instant invention; however, the characteristics of the instant invention are by no means restricted thereto. All changes, alterations, or modifications conveniently considered by those skilled in the art are deemed to be encompassed within the scope of the instant invention delineated by the following claims.

What is claimed is:

1. An LED package structure, comprising:
 a ceramic substrate having a top surface and a bottom surface;
 a ceramic board having a thru-hole, the ceramic board disposed on the top surface of the ceramic substrate;
 a metallic layer disposed on the top surface of the ceramic substrate;
 a soldering layer disposed on the bottom surface of the ceramic substrate;
 a plurality of conductive pillars embedded in the ceramic substrate and electrically connecting the metallic layer to the soldering layer;
 a light-emitting unit disposed above the ceramic substrate and arranged in the thru-hole, wherein the light-emitting unit is electrically connected to the metallic layer and the soldering layer;
 a first adhesive layer disposed on the ceramic board;
 a second adhesive layer stacked on the first adhesive layer, wherein the first adhesive layer is entirely embedded in the second adhesive layer, and a top surface of the first adhesive layer is entirely adhered to the second adhesive layer; and a cover fixed on the ceramic board through the first adhesive layer and the second adhesive layer.

2. The LED package structure as claimed in claim 1, wherein the cover is a plate-like covering plate, the covering plate is fixed on the ceramic board through the first adhesive layer and the second adhesive layer to protect the light-emitting unit.

3. The LED package structure as claimed in claim 1, wherein the light-emitting unit further comprises a lens, and the lens is disposed on a light-emitting surface of an UV LED chip.

4. The LED package structure as claimed in claim 1, wherein the light-emitting unit further comprises a submount disposed on the ceramic substrate and an UV LED chip disposed on the submount, the metallic layer has a positive electrode pad and a negative electrode pad spaced apart from each other, the light-emitting unit is electrically connected to the positive electrode pad and the negative electrode pad by wire-bonding.

5. The LED package structure as claimed in claim 4, wherein the light-emitting unit has a lens disposed on the submount to encapsulate the UV LED chip.

6. The LED package structure as claimed in claim 1, wherein the first adhesive layer is an UV curable resin, the second adhesive layer is an UV curable resin or a heat curable resin.

7. The LED package structure as claimed in claim 1, wherein the first adhesive layer has a plurality of first adhesive portions, the second adhesive layer has a plurality of second adhesive portions respectively covering the plurality of first adhesive portions, a surface of each of the first adhesive portions, connected to the corresponding second adhesive portion, is a ripple surface.

8. The LED package structure as claimed in claim 1, wherein the ceramic board and the cover are provided without any gap there-between through the first adhesive layer and the second adhesive layer, and an inner space of the LED package structure constructed by the ceramic substrate, the ceramic board and the cover is isolated from an outer space.

9. An LED package structure, comprising:
a ceramic substrate having a top surface and a bottom surface;
a metallic layer disposed on the top surface of the ceramic substrate;
a soldering layer disposed on the bottom surface of the ceramic substrate;
a plurality of conductive pillars embedded in the ceramic substrate and electrically connecting the metallic layer to the soldering layer;
a light-emitting unit disposed above the ceramic substrate and electrically connected to the metallic layer and the soldering layer;
a first adhesive layer disposed on the ceramic substrate;
a second adhesive layer stacked on the first adhesive layer, wherein the second adhesive layer has a concavity, the first adhesive layer is entirely embedded in the concavity of the second adhesive layer, and a top surface of the first adhesive layer is entirely adhered to an inner surface of the concavity of the second adhesive layer; and
a cover having a translucent covering plate and a ring-shaped frame connected to the covering plate, wherein an end of the frame away from the covering plate is fixed on the ceramic substrate through the first adhesive layer and the second adhesive layer.

10. The LED package structure as claimed in claim 9, wherein the light-emitting unit further comprises a submount disposed on the ceramic substrate and an UV LED chip disposed on the submount.

11. The LED package structure as claimed in claim 10, wherein the light-emitting unit has a lens disposed on a light-emitting surface of the UV LED chip.

12. The LED package structure as claimed in claim 10, wherein the light-emitting unit has a lens disposed on the submount to encapsulate the UV LED chip.

13. The LED package structure as claimed in claim 9, wherein each of the covering plate and the frame is made of a translucent material, an angle between a bottom surface of the covering plate and an inner side surface of the frame is approximately 90 degrees, a reflecting layer is selectively formed on the inner side surface of the frame; the first adhesive layer is an UV curable resin, the second adhesive layer is an UV curable resin or a heat curable resin.

14. The LED package structure as claimed in claim 9, wherein the covering plate is made of a translucent material, the frame is made of metal or silicon, an angle between a bottom surface of the covering plate and an inner side surface of the frame is smaller than 90 degrees, a reflecting layer is selectively formed on the inner side surface of the frame; the first adhesive layer is an UV curable resin, the second adhesive layer is a heat curable resin.

15. The LED package structure as claimed in claim 9, wherein at least one gap is formed between the ceramic substrate and the cover, and an inner space of the LED package structure constructed by the ceramic substrate and the cover is in air communication with an outer space via the at least one gap.

16. The LED package structure as claimed in claim 15, wherein the first adhesive layer has a plurality of first adhesive portions, the second adhesive layer has a plurality of second adhesive portions respectively covering the first adhesive portions, and a surface of each of the first adhesive portions, connected to the corresponding second adhesive portion, is a ripple surface.

17. The LED package structure as claimed in claim 16, further comprising a plurality of L-shaped light-shielding portions disposed on the top surface of the ceramic substrate, wherein the plurality of light-shielding portions are arranged adjacent to the first adhesive layer and the second adhesive layer, and a height of each of the light-shielding portions is greater than or identical to that of the first adhesive layer and the second adhesive layer.

18. The LED package structure as claimed in claim 9, wherein the ceramic substrate and the cover are provided without any gap there-between by using the first adhesive layer and the second adhesive layer, and an inner space of the LED package structure constructed by the ceramic substrate and the cover is isolated from an outer space.

19. The LED package structure as claimed in claim 18, further comprising a ring-shaped light-shielding portion disposed on the top surface of the ceramic substrate, wherein the light-shielding portion is arranged adjacent to the first adhesive layer and the second adhesive layer, and a height of the light-shielding portion is greater than or identical to that of the first adhesive layer and the second adhesive layer.

20. An LED package structure, comprising:
a ceramic substrate having a top surface and a bottom surface;
a metallic layer disposed on the top surface of the ceramic substrate;
a soldering layer disposed on the bottom surface of the ceramic substrate;

a plurality of conductive pillars embedded in the ceramic substrate and electrically connecting the metallic layer to the soldering layer;

a light-emitting unit disposed above the ceramic substrate and electrically connected to the metallic layer and the soldering layer;

a first adhesive layer disposed on the ceramic substrate;

a second adhesive layer stacked on the first adhesive layer; and a cover having a translucent covering plate and a ring-shaped frame connected to the covering plate, wherein an end of the frame away from the covering plate is fixed on the ceramic substrate through the first adhesive layer and the second adhesive layer, each of the covering plate and the frame is made of a translucent material, an angle between a bottom surface of the covering plate and an inner side surface of the frame is approximately 90 degrees, a reflecting layer is selectively formed on the inner side surface of the frame; the first adhesive layer is an UV curable resin, the second adhesive layer is an UV curable resin or a heat curable resin, the cover has a third adhesive layer and a fourth adhesive layer, the third adhesive layer is disposed on one of two adjacent surfaces of the covering plate and the frame, and the fourth adhesive layer is disposed on the other of the two adjacent surfaces of the covering plate and the frame and stacks on the third adhesive layer.

* * * * *